United States Patent [19]

Haronian et al.

[11] Patent Number: 5,856,722

[45] Date of Patent: Jan. 5, 1999

[54] MICROELECTROMECHANICS-BASED FREQUENCY SIGNATURE SENSOR

[75] Inventors: Dan Haronian, Efrat, Israel; Noel C. MacDonald, Ithaca, N.Y.

[73] Assignee: Cornell Research Foundation, Inc., Ithaca, N.Y.

[21] Appl. No.: 771,681

[22] Filed: Dec. 23, 1996

Related U.S. Application Data

[60] Provisional application No. 60/009,553 Jan. 2, 1996.

[51] Int. Cl.$^6$ .................................................. H01L 41/08
[52] U.S. Cl. ........................... 310/321; 310/331; 310/309
[58] Field of Search ................................... 310/311, 312, 310/321, 322, 329–332, 309

[56] References Cited

U.S. PATENT DOCUMENTS

| | | | |
|---|---|---|---|
| 1,806,871 | 5/1931 | Bower | 310/321 X |
| 2,769,867 | 11/1956 | Crownover et al. | 310/331 X |
| 3,336,529 | 8/1967 | Tygart | 310/331 |
| 3,457,463 | 7/1969 | Balamuth | 310/330 X |
| 3,566,166 | 2/1971 | Borner | 310/321 |
| 3,634,787 | 1/1972 | Newell | 310/330 |
| 3,686,593 | 8/1972 | Zakaria | 310/331 X |
| 4,012,648 | 3/1977 | Engdahl | 310/332 X |
| 4,517,486 | 5/1985 | Andrews | 310/331 |
| 4,711,128 | 12/1987 | Boura | 73/517 B |
| 4,736,629 | 4/1988 | Cole | 73/517 R |
| 4,764,244 | 8/1988 | Chitty et al. | 156/630 |
| 5,023,503 | 6/1991 | Legge et al. | 310/311 |
| 5,049,775 | 9/1991 | Smits | 310/328 |
| 5,072,288 | 12/1991 | MacDonald et al. | 437/203 |
| 5,162,691 | 11/1992 | Mariani et al. | 310/321 |
| 5,175,521 | 12/1992 | Larson | 333/235 |
| 5,179,499 | 1/1993 | MacDonald et al. | 361/313 |
| 5,198,390 | 3/1993 | MacDonald et al. | 437/390 |
| 5,235,187 | 8/1993 | Arney et al. | 250/306 |
| 5,245,245 | 9/1993 | Goldenberg | 310/330 |
| 5,316,979 | 5/1994 | MacDonald et al. | 437/203 |
| 5,393,375 | 2/1995 | MacDonald et al. | 156/643 |
| 5,399,415 | 3/1995 | Chen et al. | 428/209 |
| 5,515,725 | 5/1996 | Tabota et al. | 310/321 X |
| 5,563,343 | 10/1996 | Shaw et al. | 73/514.18 |
| 5,610,335 | 3/1997 | Shaw et al. | 73/514.36 |

OTHER PUBLICATIONS

"Micro Electromechanical Filters for Signal Processing" Lin, et al.; Feb. 1992; pp. 226–231.

Primary Examiner—Mark O. Budd
Attorney, Agent, or Firm—Jones, Tullar & Cooper, PC

[57] ABSTRACT

An acoustic filter array of microelectromechanical beams each having a characteristic resonance frequency response to mechanical and/or acoustical vibration. The array divides incoming acoustic signals into a plurality of discrete spectral components, each of which may be separately detected and converted into corresponding electrical signals. The acoustic filter may be integrated onto a single crystal silicon substrate with electrical circuitry for performing acoustic signal processing functions required for applications such as speech processing and simulating the physiological function of the ear.

27 Claims, 10 Drawing Sheets

MICROELECTROMECHANICS-BASED FREQUENCY SIGNATURE SENSOR

This invention was made with government support under Grant No. DABT 63-92-C-0019, awarded by the Advanced Research Projects Agency. The government has certain rights in the invention.

BACKGROUND OF THE INVENTION

This application claims the benefit of U.S. Provisional Application No. 60/009,553, filed Jan. 2, 1996, the disclosure of which is hereby incorporated herein by reference.

The present invention relates, in general, to vibration sensors, and more particularly to detectors for sensing acoustic and other vibrations and for producing corresponding electric output signals. Still more particularly, the invention relates to unique microelectromechanical (MEM) acoustic filters and to methods for fabricating such filters for vibration sensing and, in preferred embodiments, for sound recognition systems.

The frequency spectrum of vibrating systems contains information that can be used in many ways. This spectrum can be used for wear diagnostics, passive and active noise control, material characterization, structure identification, and for speech processing. In all of these applications, an analysis is performed on the vibration signature of a vibrating system. Thus, for example, a vibration is sensed by means of a preprocessor that can be a microphone or an accelerometer. The preprocessed information is analyzed using, for example, a Fast Fourier Transform (FFT) to extract the frequency spectrum of the vibration. This spectrum is then processed according to the specific application.

In the area of wear diagnostics, the frequency signature of a vibrating system is used to study the mechanical wear of the system. In such systems, the noise from a vibrating system is analyzed to determine its frequency spectrum. As a system wears, the spectrum changes and, depending on the change, it is possible to predict what part of the system needs to be replaced before the system fails. Such systems are important for applications requiring controlled shut-down, such as is required in electric power plants, nuclear power plants, aircraft, and the like.

In active noise control systems, a sound radiation frequency signature of a system is mapped, and loudspeakers are driven to produce controlled interference with the radiated sound. In addition, the frequency signature at various locations within the pattern of radiation is used to control a quality of the radiated sound. The radiation pattern of the system is detected by microphones, shaped polyvinylidene fluoride (PVDF) sensors, or accelerometers.

The elastic properties of a solid can be evaluated using its acoustical signature by exciting an object by ultrasonic waves. The signature is obtained by recording the acoustical signal reflected from the object at different distances. Materials can also be characterized by measuring the reflected time-frequency spectrum, and the velocity and/or the absorption spectrum of acoustic waves can be used to characterize the biochemical properties of liquids. It is also possible to identify a structure using the acoustic signature of the reflected and radiated sound wave. Since the structure signature is not only a function of the material, but of the geometry of the structure, the spectrum changes when the structure is moved. Therefore, a change in the acoustic signature of a structure may signal a change in its mechanical properties or a change in its location.

Speech processing is one of the most complicated applications of the acoustic signature detection and processing. Conventional speech processors extract information from sound using spectrograms created by Fast Fourier Transform (FFT) or Linear Predictive Coding (LPC) algorithm. These methods both present a frequency spectrum of an input acoustic signal to a processor which is used to analyze the signal according to a selected computational algorithm. However, this method of processing speech signals is distinguishable from, and is inferior to, the signal processing which occurs in the human ear. To improve on this method, speech processors based on physiological models of the ear have been developed. Such models are based on the mechanical response of the ear, including the response of the outer ear, the middle ear, and the inner ear which contains the cochlea. The cochlea contains elements, including the basilar membrane, which are responsible for converting the acoustical signals into electrical signals on the nerve fibers of the ear. The mechanical properties of the basilar membrane change along its length so that it is capable of resonance at frequencies from about 50 Hz up to about 20 KHz. When sound excites the cochlea, it locally vibrates the basilar membrane. The location of the vibration along the basilar membrane depends on the exciting frequency, so that the membrane acts as a mechanical bandpass filter.

Attempts have been made to replicate the functions of the ear in mechanical or electrical structures to produce an artificial ear, as for speech recognition systems and the like. Thus, a basic speech recognition system might include a transducer or microphone for converting the speech sound waves into electrical signals, an FFT or LPC algorithm for preprocessing the received signals, and a pattern matching and classification processing section, where a digitized version of the speech signal is compared with stored word patterns from a memory. By applying a decision rule processing algorithm to the pattern-match speech signal and stored word patterns, an identification output corresponding to the speech sound waves is provided. The pattern matching, classification and identification components of a speech recognition system can generally be represented in three ways: first, through models based on conventional algorithms; second, through models based on neural networks; and third, models based on human physiology. Models which are based on neural networks receive a signal that has been preprocessed using FFT or LPC algorithms and deliver them to a simulated neural network. Active elements which represent neurons and synapses within the network control the quality of a connection between a first neuron and a second neuron. Such models are widely used for pattern recognition.

Models based on human physiology imitate the function of the human ear in order to perform speech recognition. In such models, preprocessing is carried out by components which represent the outer ear, the middle ear and the inner ear, including the cochlea. As noted above, the cochlea contains all the parts that are responsible for converting the acoustic signals into electrical signals which are sent to the nerve fibers of the ear. Models based on human physiology include software models of the physical structure of the cochlea for channeling the acoustic signals along the cochlea, as well as models of the tectorial, reissner and the basilar membranes, as well as the inner and outer hair cells.

Since the mechanical resonance properties of the basilar membrane change along its length, when sound enters the ear, it excites the membrane and produces a travelling wave that decays sharply after the resonance point is reached. Thus, the basilar membrane and the cochlea provide a mechanical filter that divides the received frequency spectrum into bands of frequencies. The response of the basilar membrane is digitized by the inner hair cells attached along its length, these inner cells being mechanico-electric transducers that translate the mechanical vibrations of the basilar membrane into electrical signals. The inner ear cells are connected to the nerve fibers that are the electrical input for the physiological system that processes the sound.

Many aspects of the hearing process have been studied, and it is possible to find models which imitate various ear functions such as sound localization, spectral estimation, and pitch perception. In addition, auditory-based models performing speech processing have been developed. These models are based on speech coding in the auditory periphery through the average firing rate of the auditory fibers their discharge synchrony and temporal activity, and the tototopic organization of the basilar membrane.

When the performance of conventional signal processing techniques and physiological approaches as modeled on a computer were compared, it was discovered that the physiological spectrogram was better in identifying steady-state vowel formants in a noise background. Therefore, it appeared that the physiological modeling was more efficient than other modeling methods. In physiological modeling, however, the basilar membrane motion was replaced by a model of a filter bank, and the responses of the hair cells and of the nerve fibers were modeled to resulted in a simulated physiological preprocessing of the sound by operation of a computer program. This approach, as well as other modeling approaches, were simply attempts to use a transducer output from a conventional microphone for speech recognition, while trying to overcome the shortcomings of that transducer through the application of computational algorithms. However, none of these models benefit from the natural function of the physiological acoustical filter of the human ear.

A need exists, then, for an acoustic filter which can be made to function in the same manner as a cochlea. This filter would ideally be extremely small and would be capable of being fabricated on semiconductor chips for integration with signal processing circuitry.

Attempts have been made to produce extremely small acoustic transducers utilizing standard polysilicon micromachining methods, but these devices necessarily suffer from the shortcomings of that technology; i.e., certain transducer shapes are not possible because mechanical elements executed in polysilicon are limited to a maximum thickness of approximately 2 micrometers. This limitation makes polysilicon unsuitable for high aspect ratio structures, which are much greater in thickness than in width; in addition, such elements are usually relatively expensive to produce in polysilicon.

An unmet need exists for an extremely small acoustic sensor, and particularly to such a sensor which can function as a mechanical filter in the manner of a cochlea, and still more particularly for an inexpensive structure which can be fabricated into semiconductor chips and integrated with signal processing circuitry.

SUMMARY OF THE INVENTION

It is an object of the present invention to provide an improved microelectromechanical (MEM) acousto-mechanical structure capable of sensing vibratory motion, and particularly acoustical vibrations.

It is a further object of the invention to provide a MEM structure sensitive to acoustical vibrations and which acts as an acoustic filter for separating incoming acoustic signals into a plurality of discrete spectral components.

Another object of the invention is the provision of a MEM acoustic filter structure fabricated from high strength, high aspect ratio, released beams.

Still another object of the invention is the provision of an acoustic filter which is integrated into a single crystal silicon substrate with electrical circuity for performing acoustic signal processing functions.

Another object of the present invention is the provision of a MEM structure which simulates physiological functions of the human ear.

Another object of the invention is to provide a MEM-based Artificial Cochlea (MEMBAC).

Still another object of the invention is to provide a MEMBAC which will serve as an input layer to physiologically-based processors to produce a real time sound processor that will mimic various aspects of hearing.

Briefly, the present invention is directed to transducers which are responsive to vibrations for producing corresponding electrical signals, and more particularly to transducers responsive to the frequency spectrum of a vibrating system for producing signals representing the frequency signature of such a system. The transducer is a microelectromechanical device which can be fabricated on a single crystal silicon substrate which may also include processing circuitry. Such a structure provides an extremely small, inexpensive device which can be used in a wide range of applications such as in a vibration sensor, in an accelerometer, as a bandpass filter, or the like. The invention will be described herein in general terms as an acoustical transducer or sensor, and in greater detail as an acoustic filter having particular application as a detector for the frequency spectrum of sound waves for use in speech processing and recognition. Such a filter for use in speech processing may be designed to mimic the cochlea of an ear, and thus may be referred to herein as an artificial cochlea.

The microelectromechanical structure of the present invention consists of a planar array of generally parallel, released, high aspect ratio beams mounted to a substrate of, for example, single crystal silicon. The beams may have a width of about 0.5–1.0 $\mu$m and a height of about 5–10 $\mu$m, with the length of each beam being selected to provide a particular resonant frequency for that beam. Thus, for example, beams having a width of 1 $\mu$m, a height of 10 $\mu$m and lengths of between 370 micrometers and 7 millimeters will have resonance frequencies between about 100 Hz and 20 KHz. In a typical array the gap, or spacing between adjacent beams, will be about 20 micrometers, and is selected to control the coupling between the beams. The overall length of a typical array, in a direction perpendicular to the beams, will depend upon how many beams are used, but may, for example, be about 3 millimeters. The beams may be fixed at one end and cantilevered so that the second end is free, or in the alternative the beams may be fixed at both ends, with the center part free. Such beams may be referred to as released beams; i.e., beams which are supported so that at least a part of each beam is free to move with respect to its support.

The beams of the array are flexed or deformed by impinging acoustic waves, causing each beam to be repeatedly stretched, and when impinged by waves of a matching frequency, to vibrate with a resonant frequency determined by the beam dimensions and material, with each beam being carefully tuned by selection of its dimensions. In addition, the array may include an adjustment mechanism, such as capacitor plates adjacent the beams, to permit adjustment of the stiffness of selected beams and consequent dynamic tuning of the structure for use in a variety of environments. Such an adjustment mechanism allows one array to be used in a variety of temperatures or humidities and permits compensation for material aging. In accordance with the invention, a transducer is provided to convert the mechanical motion of each beam into a corresponding electrical signal. Suitable transducers include electrostatic capacitors, piezoresistors, a laser vibrometer, or the like.

The MEM array may be fabricated using a process known as the Single Crystal Reactive Etch and Metalization (SCREAM) process described, for example, in U.S. Pat. No. 5,198,390, the disclosure of which is hereby incorporated herein by reference, but preferably is fabricated using the improved single-mask SCREAM process described in copending U.S. application Ser. No. 08/310,336 of Shaw et al., filed Sep. 22, 1994, the disclosure of which is hereby incorporated herein by reference. With this process, the beams are fabricated from a substrate such as single crystal silicon (SCS), so that the beams are integral with the substrate, but at least partially released from it to permit relative motion. The SCS substrate may carry integrated circuits which may be electrically connected to transducers sensitive to beam motion.

In a preferred form of the invention, the MEM array is utilized as an acoustic filter for use in detecting acoustic patterns or signatures, and thus mimics many of the functions of the basilar membrane of a cochlea. The two-dimensional array of coupled MEM beams does this by mechanically filtering the acoustical input into a plurality of discrete frequency bands and by producing corresponding electrical output signals. The output signals are processed in suitable processing circuitry using conventional neural networks or physiological model algorithms, as discussed above, for acoustical pattern recognition functions. By combining knowledge about the hearing process with the MEM artificial basilar membrane array of the present invention, it is possible to imitate various aspects of hearing such as speech recognition, sound localization, and the like. Since the MEM array provides a real-time dynamic electrical signal analogue of a detected sound, the device can be used as an input for general purpose acoustic processors, as well.

It will be understood that when the array is utilized as an artificial cochlea, the device would also incorporate an envelope structure which channels acoustical signals to the array so that the entire structure mimics not only the basilar membrane, but the outer and middle ear transfer functions, as well. These transfer functions provide an acoustic impedance match between free space and the inner ear and provide a non-linear frequency response for the device. Such an envelope structure is not necessary for all applications of sound processing, however.

The Microelectromechanics-Based Frequency Signature Sensor (MEM-FSS) of the present invention is unique in design and concept. Although conventional acoustic sensor systems receive the sound through a primitive sensor such as a microphone, an accelerometer, or the like, and retrieve the acoustical information using electronics, the MEM-FSS, to the contrary, analyzes the sound at the detection stage. That is, most systems receive their input signals through a single sensor that responds to the entire spectrum, and the sensor feeds a spectrum analyzer where the information is processed. Since the sensor responds to the entire spectrum, the frequency spectrum is convoluted with the non-linear detector response. This is due to cross-talk between different frequencies. In microphones, for example, the vibrations of the membrane at low frequencies affects the response of the microphone at high frequencies. Therefore, the information at high frequencies is not accurate. In the MEM-FSS of the present invention, on the other hand, different frequencies are sensed at different locations of the array. Although cross talk occurs between beams through acoustical coupling and through the mechanical coupling provided by the beam supports, by controlling the gap between adjacent beams and by controlling the structure and location of the beam supports, it is possible to minimize or to tailor the cross talk between the beams, and thus to minimize or tailor the information distortion.

The MEM-FSS transducer is a very small device and does not consume much energy. A system using this device as a receiver will be small not only because of the small dimensions of the device, but also because the device senses the frequency spectrum directly without the need for a spectrum analyzer. The MEM-FSS can also be viewed as a mechanical memory, since each of the beams in the array senses only frequencies that fall into its particular response band. Thus, the MEM-FSS can be faster than a conventional microphone-analyzer system of comparable size. In addition, the MEM-FSS is based on microelectronics technology which allows mass production of the device and, as a consequence, permits its use in low cost systems.

BRIEF DESCRIPTION OF THE DRAWINGS

The foregoing, and additional objects, features and advantages of the invention will become apparent to those of skill in the art from the following detailed description of preferred embodiments, taken in conjunction with the accompanying drawings, in which.

DETAILED DESCRIPTION OF PREFERRED EMBODIMENTS

Figure 1:
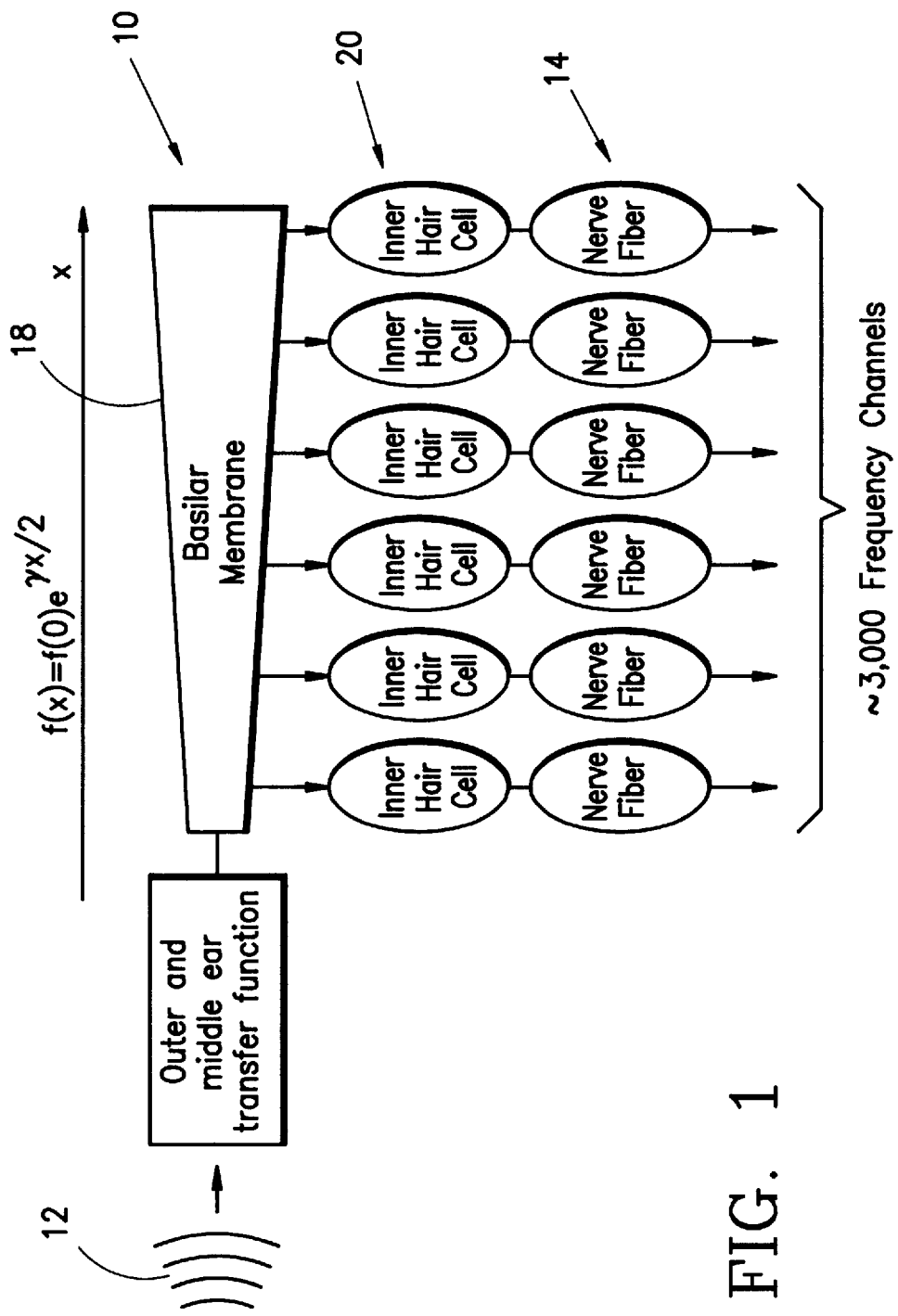
FIG. 1 is a diagrammatic illustration of the function of an ear.

The present invention, although broadly directed to vibration sensing, has as its goal the detection of sound in a manner which closely replicates the operation of the ear. Although vibration sensors have wide use, they are of particular interest herein for the detection of frequency signatures which may be produced by mechanically, electrically, or magnetically-induced vibrations. The ear responds to such frequency signatures in a unique way, as illustrated in FIG. 1, and accordingly the replication of the response of the ear although highly desirable, is a complex problem. As illustrated in FIG. 1, the ear 10 contains all the parts that are responsible for converting incoming acoustic signals 12 into electrical signals along nerve fibers 14. The mechanical structure of the ear includes portion 16 which performs the outer and middle ear transfer functions to channel acoustic signals to the cochlea, which includes the tectorial, the reissner and the basilar membranes 18, as well as the inner and outer hair cells 20. The cochlea, being a very complex mechanical system, currently has no comprehensive model that takes into account all of the relevant factors that shape its response to sound waves. The basilar membrane 18 has, in the past, been modeled by an array of uncoupled resonators, each behaving like a low-Q bandpass filter. However, this model is based on the coupling between a fluid and a resonator and does not take into account inter-resonator coupling.

Figure 2:
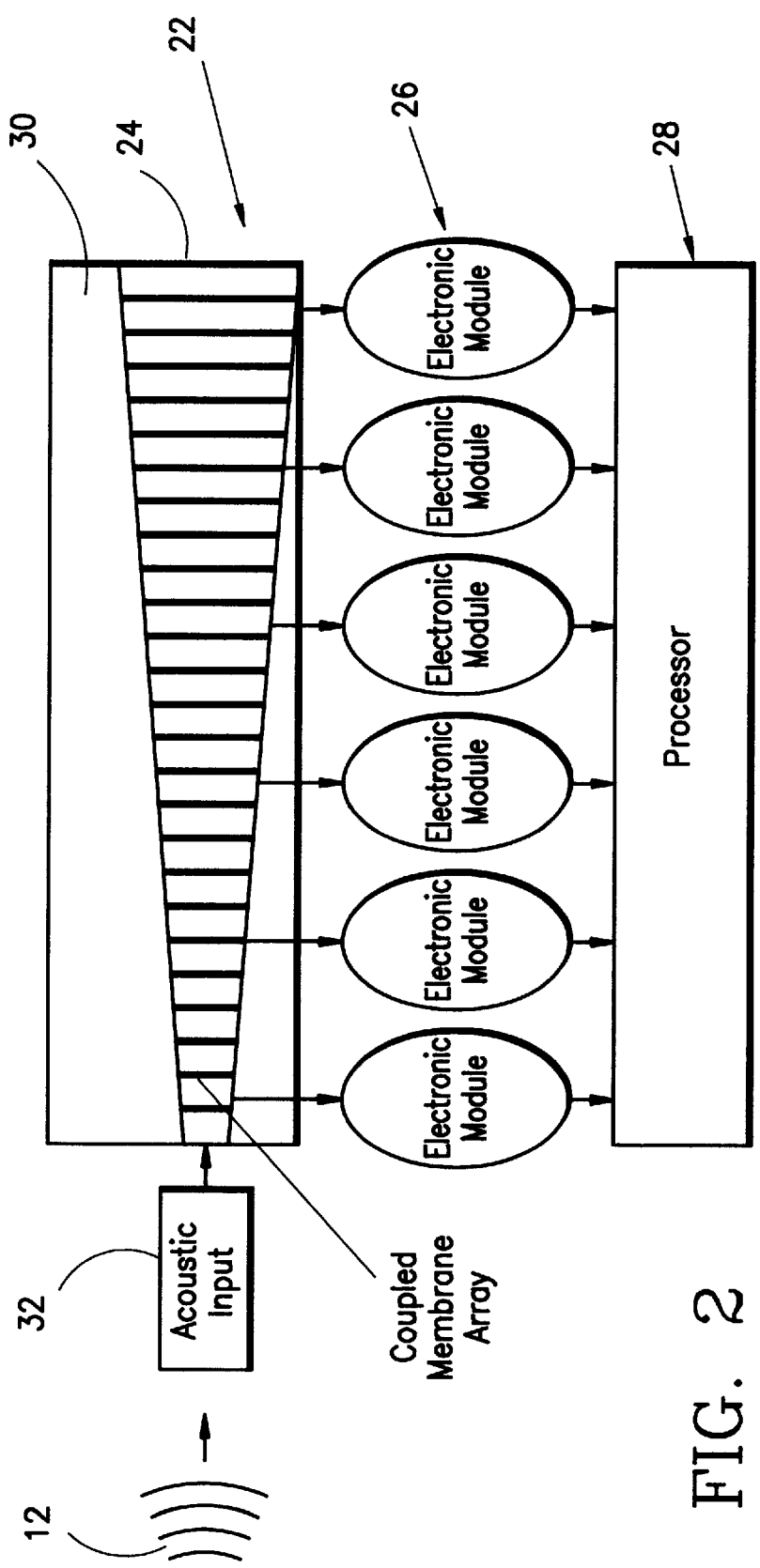
FIG. 2 is a diagrammatic illustration of a microelectromechanical-based frequency signature sensor constructed in accordance with the present invention, and which may be used in the construction of an artificial basilar membrane for an ear.

The present invention, as diagrammatically illustrated at 22 in FIG. 2, is directed to a microelectromechanical acoustic filter structure that is usable to imitate at least some of the mechanico-electrical properties of the cochlea. A Microelectromechanics-Based Artificial Cochlea (MEMBAC) is composed of mechanically active and passive parts. The active part includes an array 24 of acoustically coupled resonator beams which form a Discrete Basilar Membrane (DBM) as well as electronic modules 26 which transfer signals from the DBM array 24 to a processor 28. The passive parts are the DBM support 30 which may be a substrate on which the array is fabricated, and an envelope structure 32 which channels the acoustic signals to the DBM. The envelope 32 is designed to mimic the outer and middle ear transfer functions, and includes an impedance matching mechanism for the acoustic signals. The envelope, which is optional, may have a non-linear frequency response.

Figure 3:
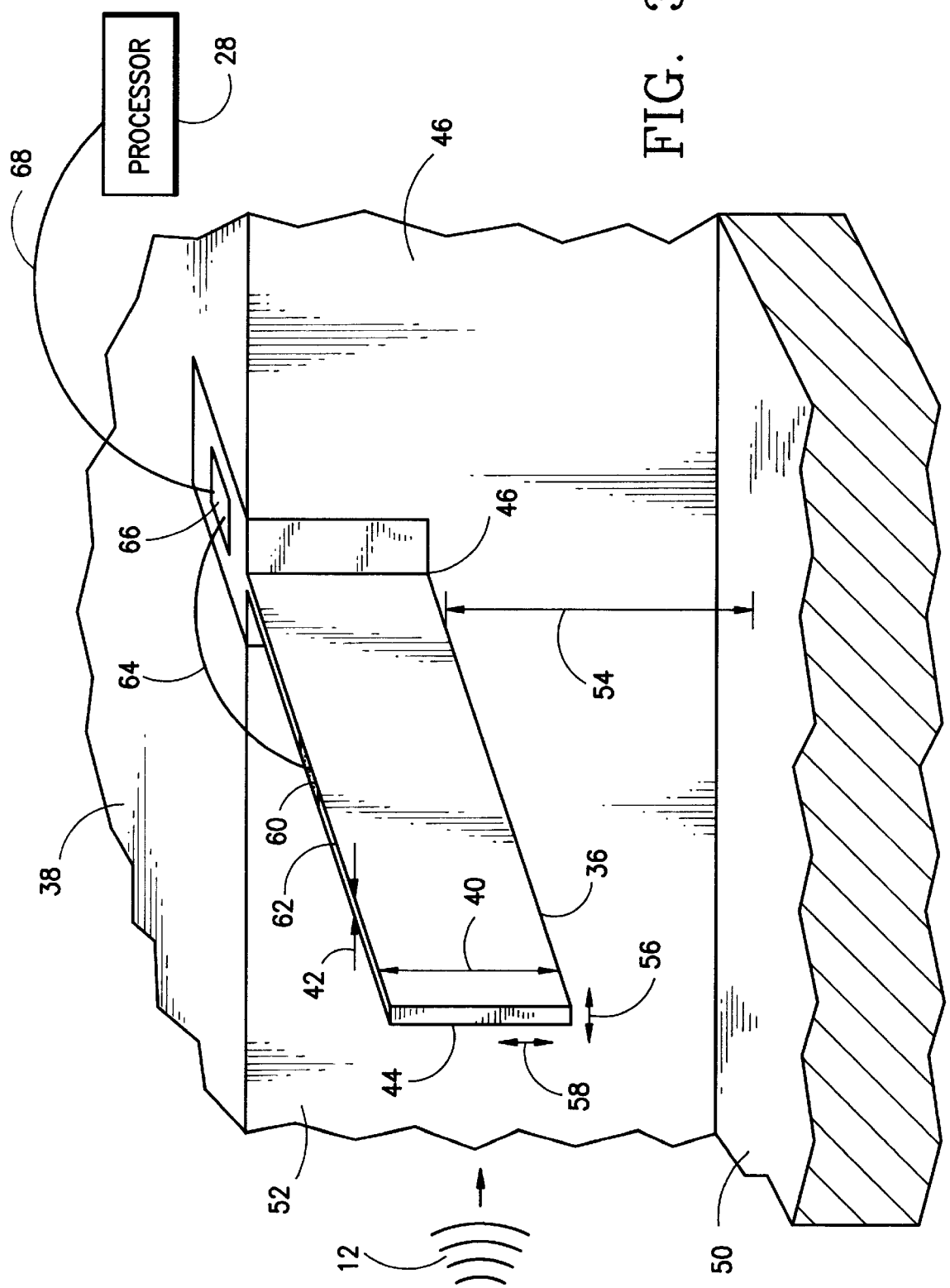
FIG. 3 is a diagrammatic perspective view of a released cantilevered microelectromechanical beam usable as an acoustic filter element, the beam having a fixed end and a free end.

The basic element of the DBM is illustrated in FIG. 3 as including a miniature acousto-mechanical sensor 34 which incorporates a resonator 36. The sensor 34 is responsive to the acoustic signal 12 which is carried in an ambient fluid medium such as air. The resonator 36, in accordance with the invention, is a microelectromechanical (MEM) released structural beam which is sufficiently flexible to be deflected by the acoustic signal 12. The resonator 36 is illustrated, in this embodiment, as a high aspect ratio, cantilevered, released beam fabricated from, and integral with, a substrate 38 which preferably is single crystal silicon. The aspect ratio of the beam is defined as the ratio of the beam height 40 to the beam width 42, and generally is greater than 5:1 and preferably is 10:1 or greater.

The resonator 36, as illustrated in FIG. 3, has a first end 44 which is free, and a second end 46 which is integral with, and fixed to, the substrate 38, as to a vertical wall 48, to form a "fixed-free", or cantilevered beam. Resonator 36 extends horizontally from wall 48 over a generally planar, horizontal floor 50 of a recess or cavity 52, which is formed, for example, during fabrication of the MEM structure in the substrate 38, and is suspended over the floor at a selected height 54. This height is chosen to define an acceptable boundary layer of fluid below the beam, as may be required for proper response of the beam to impinging acoustical signals.

The resonator 36 has a height, width and length, and is constructed of a material, which allows it to flex and to be capable of vibration at a resonant frequency in response to an acoustic signal 12 having a selected frequency or band of frequencies. The high aspect ratio of the beam tends to constrain the vibration to a direction parallel to the beam width, generally indicated by arrow 56, although there may be some vibration which has a vector in the direction of arrow 58, perpendicular to the beam width.

High aspect ratio MEM devices in the form of sensors, microactuators, and other structures have been produced, wherein a movable, released structure having one or more beams or plates is provided. Such structures may be electrostatically driven by nearby electrodes to provide microactuators, or may be sensors which move in response to external forces, with such motion being detectable by nearby electrodes. The provision of electrodes such as parallel capacitor plates on the surfaces of adjacent stationary and movable MEM structures for controlling and/or sensing the motion of one with respect to the other is illustrated, for example, in U.S. Pat. No. 5,235,187, the disclosure of which is hereby incorporated herein by reference. This patent illustrates a number of applications for high strength, high aspect ratio single crystal silicon beam structures and illustrates the use of such structures in systems for producing and/or sensing motion.

In a preferred embodiment of the present invention, the sensor 34 generates an output electrical signal in response to the mechanical deflection of resonator 36 by way of a suitable transducer such as parallel capacitor plates of the type illustrated in U.S. Pat. No. 5,235,187, or by way of a piezoresistive transducer such as that illustrated at 60 in FIG. 3. Other transducers such as, for example, a laser vibrometer, may be used for converting the mechanical motion of the beam 36 to corresponding electrical signals or to optical signals which may then be converted to electrical signals. A process for fabricating a piezoresistive transducer 60 on a MEM beam; for example, on a top wall 62 of such a beam, is described in U.S. Pat. No. 4,764,244, wherein the deposition of a piezoelectric element onto a micromachined structure is described. The transducer 60 is connected by way of line 64, which may be a conductive layer deposited on the wall 62 of resonator beam 36, to a connector pad 66 located on substrate 38. This pad may be connected by way of a line 68 to the processor 28 described above with respect to FIG. 2.

Figure 4:
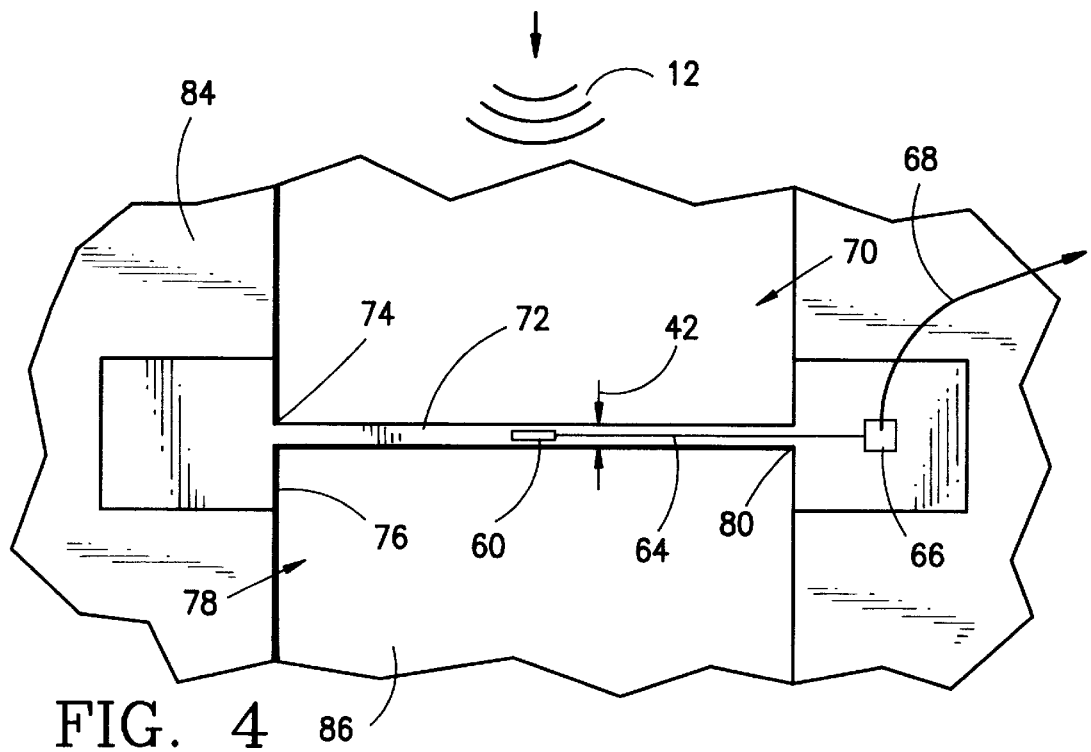
FIG. 4 is a diagrammatic top plan view of a released MEM beam acoustic filter element fixed at both ends.

An alternative, and preferred, resonator element 70 is illustrated in top plan view in FIG. 4, wherein the resonator is a MEM beam 72 which is fixed at both ends, with the center portion being released. As illustrated, beam 72 includes a first end 74 which is fixed to a first wall 76 of a cavity 78, and a second end 80 which is fixed to a second wall 82 of the cavity. The cavity may be formed in a substrate 84, which preferably is single crystal silicon, during the fabrication of the MEM beam. As illustrated, the cavity 78 includes a floor 86 which is generally planar, with the sidewalls 76 and 82 forming sides of the cavity. The resonator beam 72 extends across the cavity and is released from it; i.e., it is spaced above the floor 86 to form a "fixed—fixed" beam having a length which is determined by the width of the cavity and which is selected in accordance with the desired resonant frequency for the resonant beam. It will be understood that the vibration of the beam 72 in response to an acoustic wave may be detected by a suitable transducer such as the piezoresistive device 60 described with respect to the embodiment of FIG. 3. As there described, the transducer 60 may be connected by way of a suitable conductor 64 to a contact pad 66 located on the surrounding substrate 84.

Figure 5:
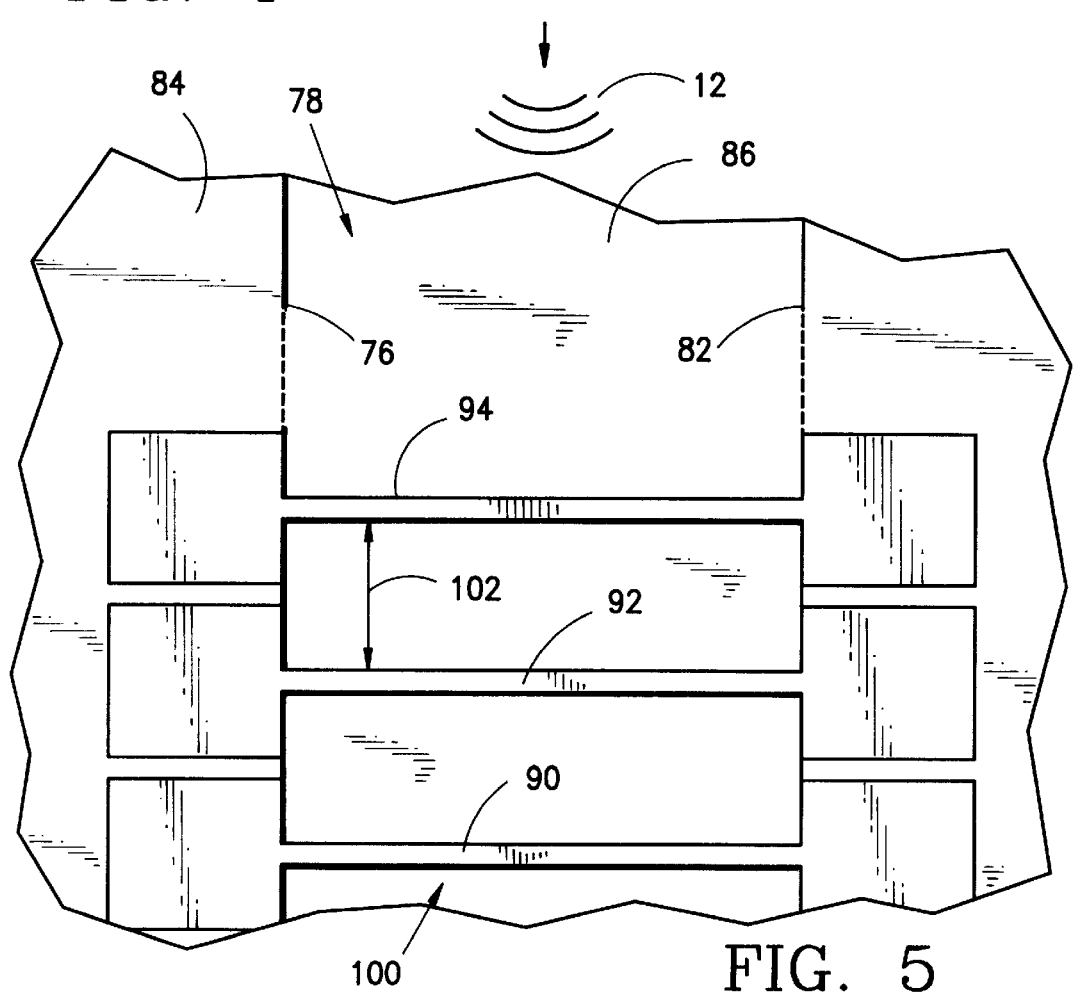
FIG. 5 is a diagrammatic top plan view of a plurality of parallel MEM beam acoustic filter elements fixed at both ends.

In a preferred form of the invention, a plurality of fixed—fixed MBM resonators, or beams, are mounted in the cavity 78 in close proximity to each other, as illustrated by beams 90, 92, 94, etc. in FIG. 5 to form an acousto-mechanical sensor array 100. The MEM beams preferably are parallel to each other and to the floor 86 of the cavity, and are spaced apart by the gap 102, with the gaps between the adjacent beams being about 20 $\mu$m. Although the beams may be more closely spaced, and may be as close as 8 $\mu$m, experimental tests of arrays having gaps of between about 4 $\mu$m and about 20 $\mu$m gave best results with 20 $\mu$m gaps when the fluid in the cavity is air. This gap 102 controls the coupling between adjacent beams when they are driven to vibration by an impinging acoustic wave 12 and affects the resonant frequencies of the beams.

Figure 6:
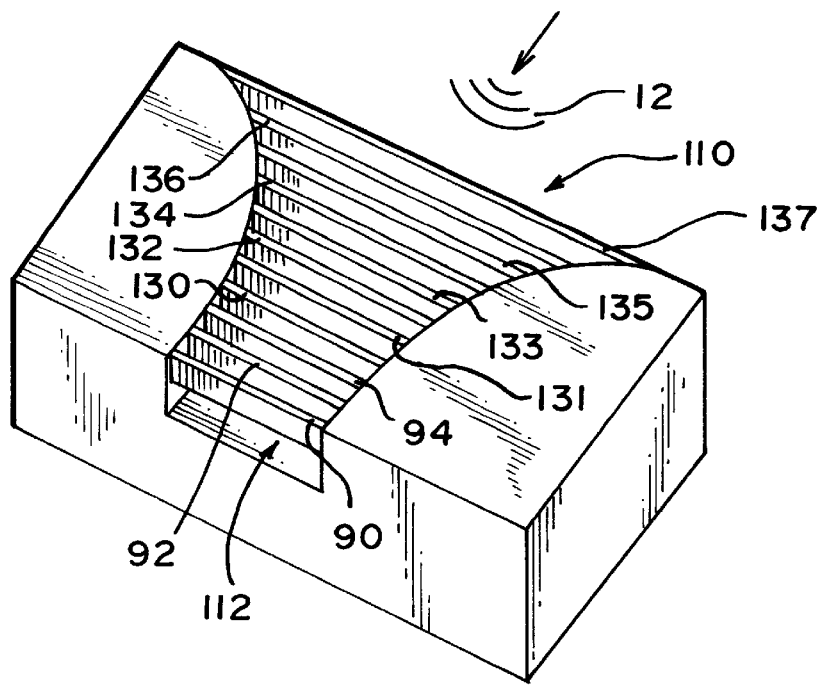
FIG. 6 is a diagrammatic perspective view of an array of MEM beam acoustic filter elements, wherein the beams are of different lengths and are fixed at both ends.

In order to provide an acoustic filter which produces selective output signals in response to an input acoustic signal, the resonant frequencies of the multiple beams illustrated in FIG. 5 are fabricated with various lengths, so that each beam is resonant at a different input frequency. Thus, the lengths of adjacent beams may be increased in an exponential pattern, as illustrated in FIG. 6 for an acoustic array 110, the lengths of beams 90, 92, 94, etc. differing while maintaining the cross-sectional dimensions of the beams constant. The resonant frequencies of the illustrated beams vary in accordance with the equation:

$$f_n = f_0 e^{-\gamma n \Delta x/2} \tag{1}$$

where n is the index of the beam, $\gamma$ is the rate of frequency change, $\Delta x$ is the gap between adjacent beams, and $f_0$ is the resonant frequency of the first beam in the array; for example, beam 90.

Figure 7:
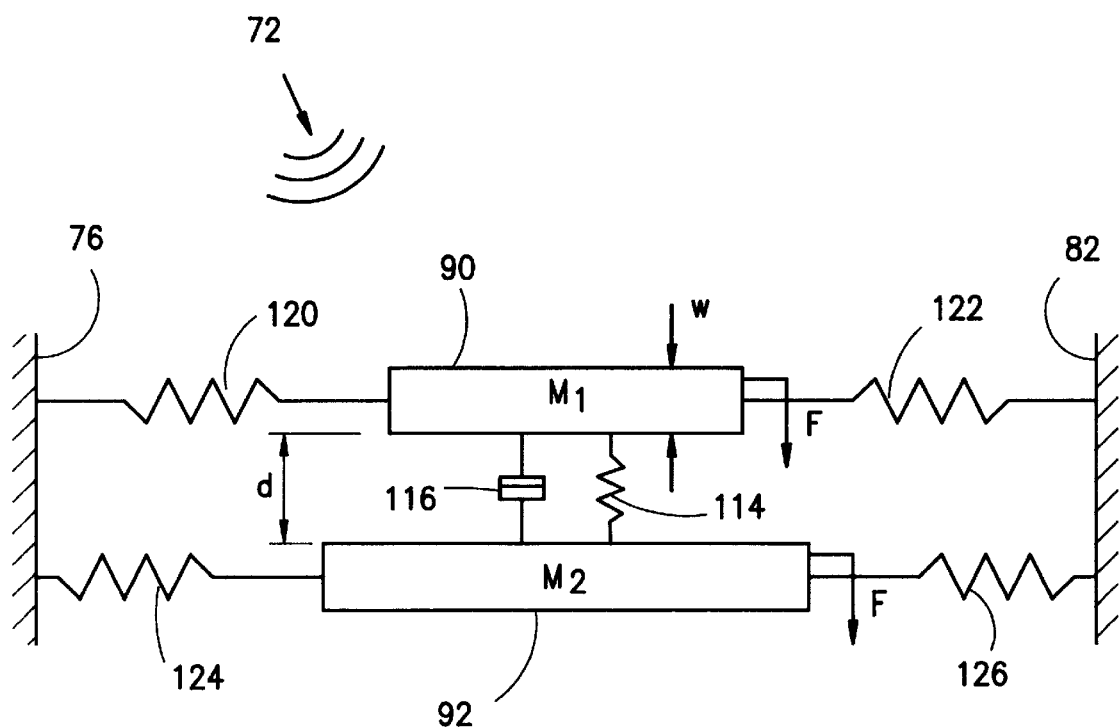
FIG. 7 is a model representing a plurality of the MEM beam acoustic filter elements of FIG. 6.

In the array 110, coupling between adjacent beams is produced by the fluid in the cavity generally indicated at 112. This fluid, which may be air, is present in the cavity 112 and between the adjacent beams. This fluid can be modeled as a "squeezed film" by analytically characterizing the fluid between the beams by a spring 114 and a dash pot 116 connected between adjacent beams such as beams 90 and 92, as illustrated in FIG. 7. The beams in the array have substantially the same aspect ratio and are of the same material, so they have the same stiffness. To change the characteristic resonant frequencies of the beams, then, the mass of each resonator is changed by varying the length of the central mass; i.e., the length of the beam between its fixed ends.

Beams 90 and 92 are modeled in FIG. 7 as different lengths, or mass M1 and M2, respectively, which respond to a force F generated by the acoustic signal 12 which impinges on the beam in a direction generally perpendicular to the length of the beam. The response of the beam to the acoustic waves 12 is by deflection of the center, or released portion of each beam, which results in an elongation of the beams between their fixed ends at the walls 76 and 82. This elongation of the beams is represented by the spring constants of springs 120 and 122 for beam 90 and the spring constants of springs 124 and 126 for beam 92.

The quality of a squeezed film may be characterized as follows:

$$\sigma = 12 \, \mu w^2 \omega / P_a d^2 \tag{2}$$

where $\sigma$ is a non-dimensional squeeze number, and is a function of the viscosity $\mu$ of the fluid medium, the beam thickness w, the pressure $P_a$ of the fluid and the gap d between the beams. For a low squeeze number, the fluid between a pair of adjacent beams i and j, which may be beams 90 and 92 in FIG. 7, does not undergo compression during deflection of the beams. In this case, the fluid spring 114 has a spring constant $K_{ij}$ of 0 and the damping coefficient of the fluid becomes:

$$C_{ij} = 0.4 A_{ij}^2 \mu / d^2 \tag{3}$$

where $A_{ij}$ is the overlapping area of beams i and j. At a high squeeze number, the spring constant $K_{ij}$ of fluid spring 114 is proportional to the product of the area for which the beams 90 and 92 overlap and the pressure of the fluid, and is inversely proportional to the gap d between the beams $$K_{ij} = P_a A_{ij} / d \tag{4}$$

and the damping coefficient becomes $$C_{ij} \cong 1/\sigma^{0.4} \tag{4}$$

The array 110 is illustrated in FIG. 6 as having 11 beams 90, 92, 94, and 130–137, each of a different length, and each resonant at a different frequency. The incoming acoustic wave may include a number of different frequencies which, taken together, represent the frequency signature of the source of the wave. This wave impinges on all of the beams in array 110, with the various frequencies in the wave 12 producing a resonant vibration only in those beams which are capable of resonance at those frequencies. Accordingly, a given acoustic wave signature will produce resonant vibration in selected beams, with the corresponding sensors on the beams producing corresponding output electrical signals. The electrical output from the array 110 is, therefore, an electric signal which represents the signature of the impinging acoustic wave, so that the array acts as a mechanical filter to segregate the incoming wave into discrete filtered components.

In the array 110, for example, each of the 11 beams will have a corresponding transducer such as the piezoelectric transducer 60 so that the device is capable of detecting 11 different frequency components of the incoming wave. The output signals are directed to a processor such as processor 28 in the manner described with respect to FIG. 3. Since the array responds only to the resonant frequencies of the beams, the device functions as a mechanical filter for the acoustic signal and provides a mechanism for detecting which frequencies are present in the incoming signal. It will be understood that the resonance of a particular beam is not restricted to a single frequency, but rather to a narrow band of frequencies, so the device responds to provide output signals which represent the presence of narrow frequency bands in the acoustic signal 12.

Figure 8:
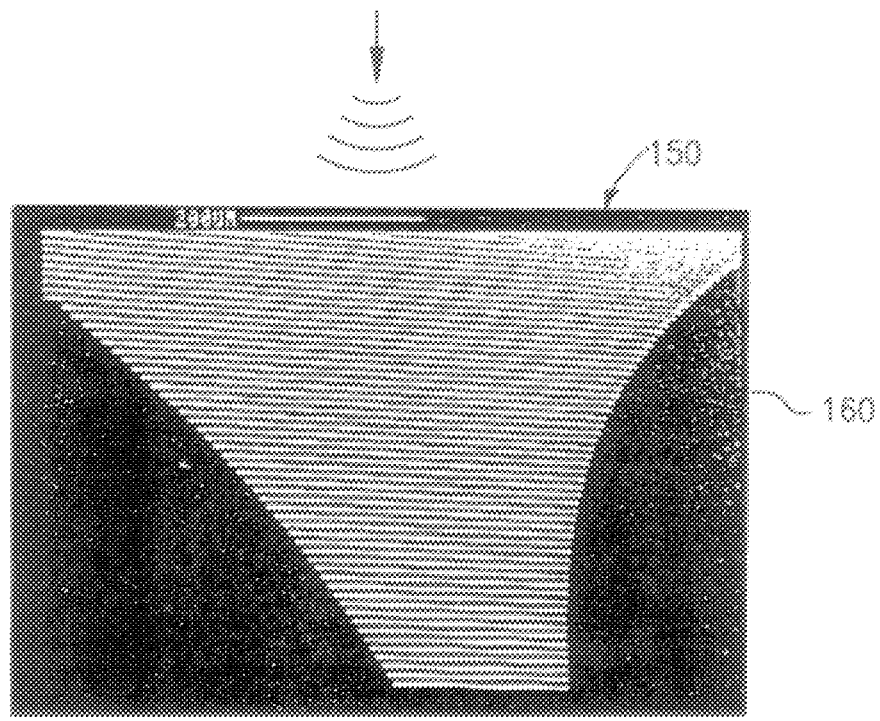
FIG. 8 is an electron micrograph of an MEM array constructed in accordance with the present invention.

An expanded version of the array 110 of FIG. 6 is illustrated at 150 in FIG. 8, which is an electron micrograph incorporating a large number of MEM beams and which is designed for handling more complex audio signals than the relatively small device of FIG. 6. Each MEM beam in the array has a width of about 1 µm and a height of about 10 µm, while the length of each beam is determined according to the frequency at which it is to resonate. For example, the length of a beam having a resonant frequency of 100 Hz would be 370 µm, assuming a cross sectional area of 1 µm, by 10 µm. Beams having a resonant frequency of 20 KHz, also with a cross section of 1 µm by 10 µm, are 7 mm long. The gap between adjacent beams for the illustrated array was 20 µm, while the overall length of the device, in a direction perpendicular to the length of the beams, was about 3 mm.

The length of each beam is determined by the function:

$$L_n = \left( \frac{4Eh^2}{0.47\rho(2\pi f_n)^2} \right)^{0.25} \quad (6)$$

where h is the height of the beam, $f_n$ is the required resonance frequency of the beam, E is the Young's modulus, and p is the density of the material forming the beams. The resonance frequency of the beam changes exponentially along the array according to Equation 1, and is varied exponentially to model the resonance characteristics of the basilar membrane. Setting the initial resonance frequency $f_0$ to be 20 KHz and the final resonance frequency $f_e$ of the array to be 100 Hz, the decay rate y is calculated from the equation:

$$y = -\frac{2}{L} \log\left( \frac{fe}{fo} \right) \quad (7)$$

where L is the length of the array. For a length of 3 millimeters, and for the initial and final frequencies noted above, the decay rate is 3500 m$^{-1}$.

Figure 9:
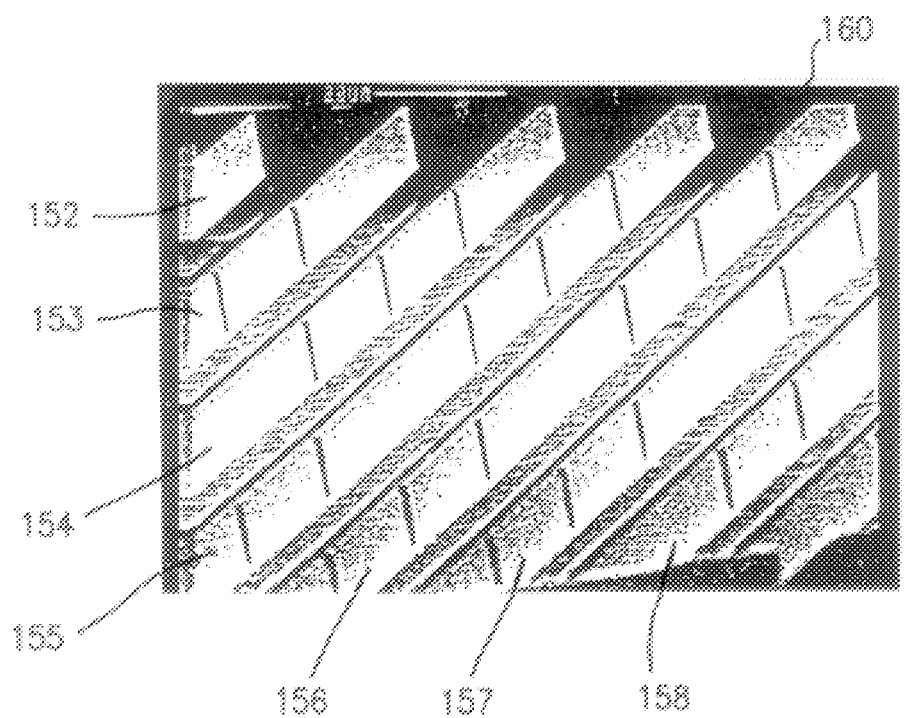
FIG. 9 is an electron micrograph illustrating a close-up view of the array of FIG. 8.

FIG. 9 is a close-up view of the array 150, illustrating multiple beams 152–158. As illustrated, the beams extend from a surrounding substrate 160, with the individual beams being arranged with their heights perpendicular to the plane of the array. Since the beams have high aspect ratios, they vibrate in a direction parallel to the plane of the array, as distinguished from a basilar membrane in an ear which vibrates in a direction vertical to the plane of the membrane. Since the dimensions of the beams in the array of FIGS. 8 and 9 are much smaller than the wavelength of the impinging sound, no pressure difference develops between the two sides of a beam so that they respond to the displacement of the air particles.

Since the beams vibrate in a direction parallel to the plane of the array, they are subject to a boundary layer effect between the beams and the floor of the cavity in which the beams are located, for the air in that location does not move. The boundary layer thickness is a function of the wavelength of the impinging sound wave, and may be approximated as follows:

$$y_0 \approx \left( \frac{v}{2\Pi f} \right)^{0.25} \quad (8)$$

where f is the frequency and v is the kinematic viscosity of air and where v is defined as $\mu/\rho$, where $\mu$ is the air viscosity and $\rho$ is the air density. At a frequency of 150 Hz, for example, $y_0$ is approximately 100 µm. For high sensitivity beams, therefore, the array should be suspended at a height of at least 100 µm above the floor of the cavity in the substrate.

The array 150 is highly directional, and accordingly the acoustical waves 12 to be detected should impinge on the array in a direction perpendicular to the height and to the length of the beams and generally in the plane of the array for greatest sensitivity. In general, the fluid medium surrounding the array will be a gas such as air, although the device can be used to detect sound waves in a liquid. The coupling between the input signal 12 and the beams, as well as the coupling between adjacent beams, is affected by the surrounding medium. The individual beams respond directly to the sound waves, with individual beams vibrating at resonance in response to corresponding frequencies in the impinging acoustical wave. This direct interaction with the sound in the MEM array differs from the response of a basilar membrane in an ear, for in the ear the membrane is continuous, and the response is digitized by the hair cells ling along it. There are about 3000 channels of hair cells that respond to basilar membrane movement, and these cells feed the nerve that are the first neuronal layer in the network that processes the sound. Thus, the hair cells and the nerve cells create a discrete mapping of the basilar membrane response to the sound entering the ear. An MEM beam array having a sufficiently large number of beams produces output signals which digitally represent the frequency signature of the input sound waves and thus approach replication of the function of the basilar membrane.

U.S. Pat. No. 5,198,390 and application Ser. No. 08/310, 336 describe processes for fabricating submicron single crystal silicon microelectromechanical structures as discussed above. In both processes, reactive ion etching is used to fabricate released single crystal silicon structures of the type utilized in the array of FIGS. 7, 8 and 9, the first using a multiple mask process, and the second using a single mask process. In the preferred form of the present invention, these processes are modified to prevent the compressive stress that can occur upon release of MEM beams. This stress is due to the use of PECVD SiO$_2$ in the masking step, and, is relieved by bending the beams when they are released, often causing them to stick together. To avoid this problem, in accordance with the present invention, the SiO$_2$ masking layer is annealed at 600° C. to produce an SiO$_2$ film that is in tensile stress. This inverts the stress on the beams, and must be taken into account in determining the resonant. A third method for fabrication is a wet etch process utilizing KOH to etch along the (111) direction of the substrate crystal structure.

Figure 10:
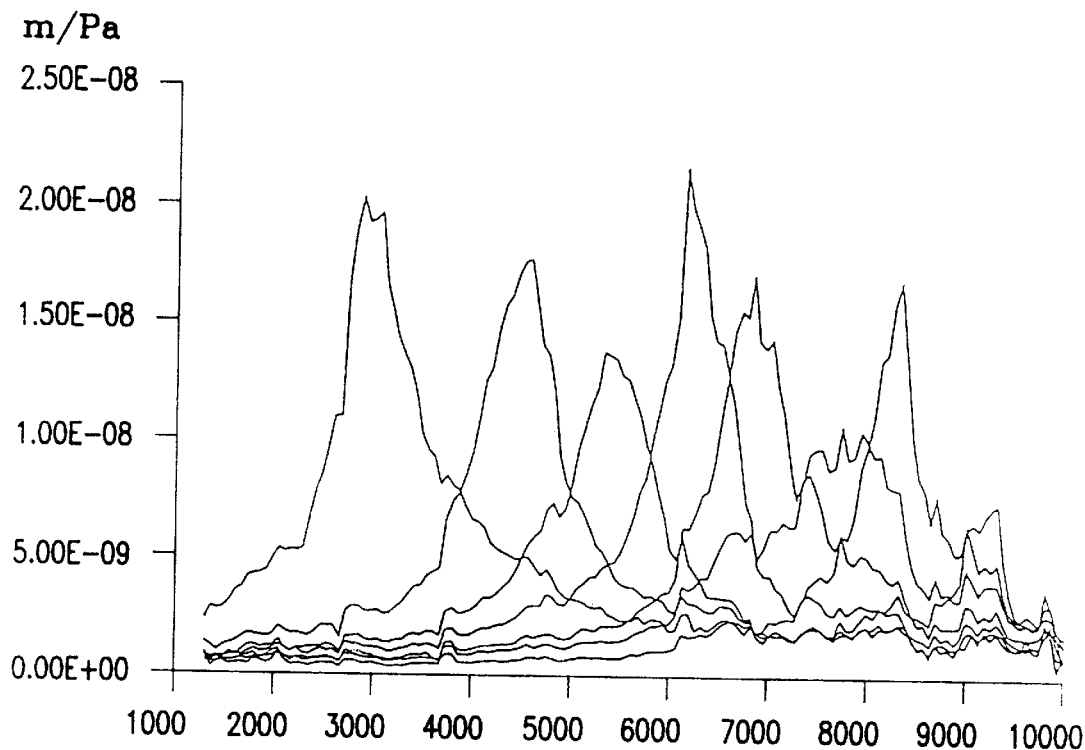
FIG. 10 is a graphical depiction of the sensitivity of a beam in the array of FIG. 9 as a function of frequency, as measured by a laser vibrometer.

The resonance characteristics of a sample array such as that illustrated in FIG. 8 was tested in air at atmospheric pressure, with the response characteristics being measured by a laser vibrometer. Such a vibrometer utilizes the Doppler shift of light scattered from the beams as a measure of vibration. The Doppler shift is proportional to the velocity of the vibrating beam. The results of these measurements are illustrated in FIG. 10, which shows the sensitivity of several beams as a function of their frequencies of vibration. In this measurement, the beams were exposed either to a continuous or to a pulsed white noise, and only beams close to each other have similar resonance characteristics.

Figure 11:
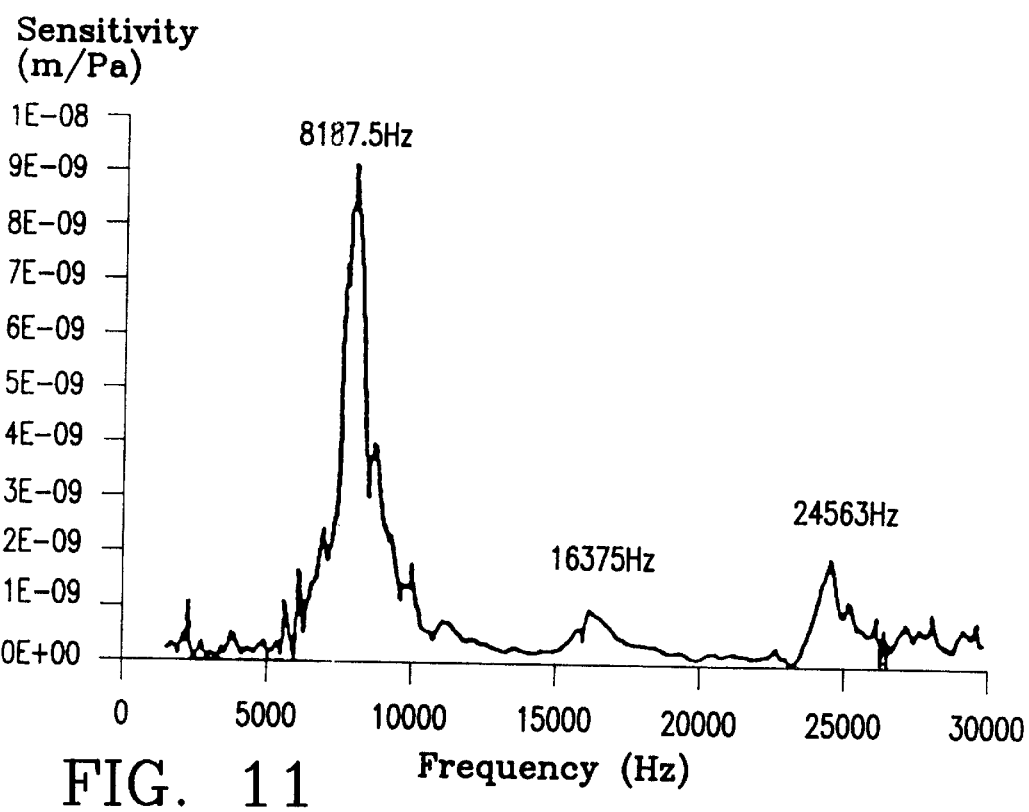
FIG. 11 is a graph of the response of a beam in air.

The second and third vibrational modes of a single fixed—fixed beam in the array were measured, and this measurement is illustrated in FIG. 11. In this measurement, the second and third modes were found to be multiples of the first mode, and such results do not agree with the theory of fixed—fixed beam vibrations, indicating that the beams of this array are not simple-fixed-fixed beams, but act more like vibrating strings.

Figure 12:
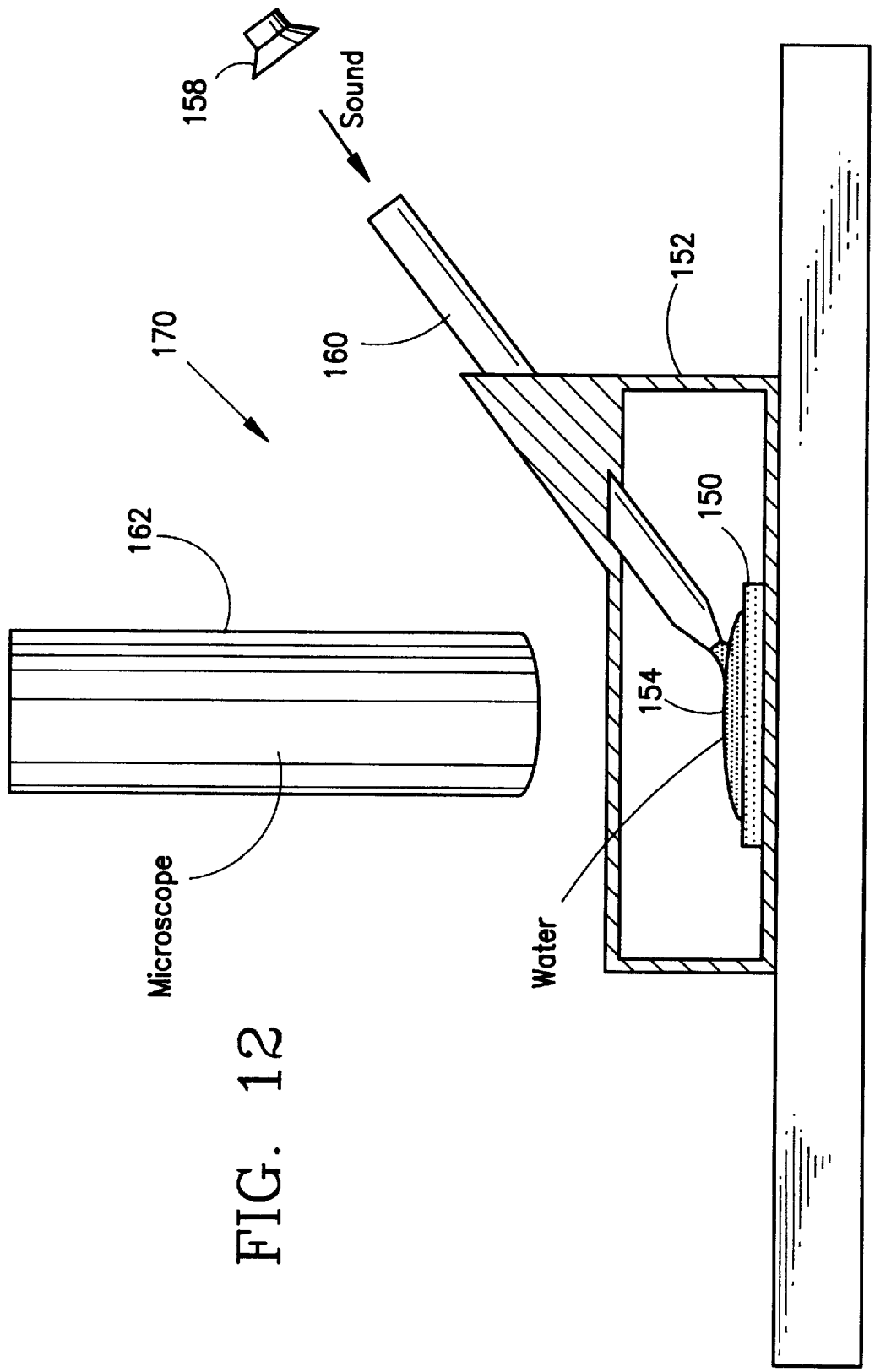
FIG. 12 illustrates a test set up for measuring the response of the array of FIG. 8 under water.

The response of the array of FIG. 8 was also tested under water, and FIG. 12 illustrates a sample set-up 170 for this test. The sample array 150 was placed in an enclosure 152 and a drop of water 154 was placed on the array. Sound waves 156 generated by a loudspeaker 158 were channeled into the drop through tubing 160 and a microscope 162 was focused on the array. The sound frequency was shifted between two values, and the dynamic response of the array was observed through the microscope 162.

Figure 13:
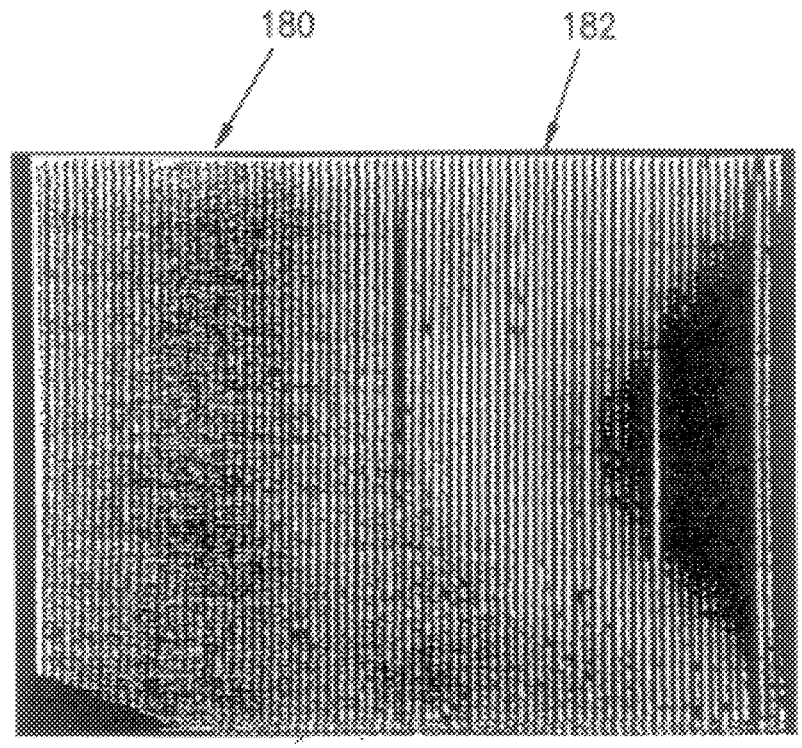
FIG. 13 is an electron micrograph of the array of FIG. 8 under water and responding to sound waves at a frequency of 2.5 KHz.
Figure 14:
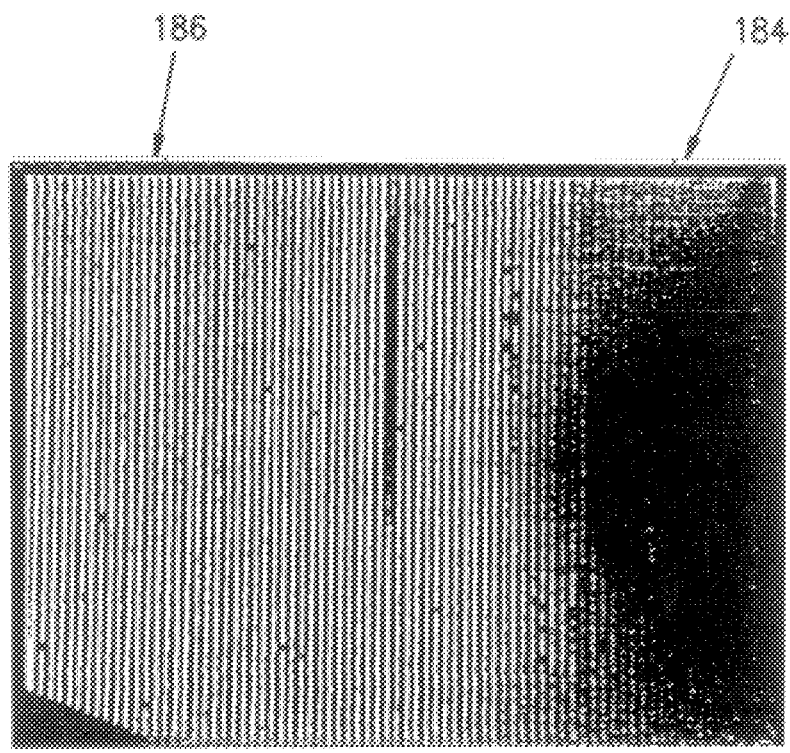
FIG. 14 is an electron micrograph of the array of FIG. 8 under water and responding to sound waves at a frequency of 2.3 KHz.

FIGS. 13 and 14 show the response of the array 150 to two different frequencies. FIG. 13 shows the results for an acoustic frequency of 2.5 KHz, illustrating that the beams toward the left of the array, generally indicated at 180 were vibrating under the influence of the impinging sound waves, while beams toward the right side of the array, generally indicated at 182, were not vibrating. In FIG. 14, an impinging wave having a frequency of 2.3 KHz caused the beams at the right side of the array, indicated at 184, to vibrate, while the beams toward the left side of the array, generally indicated at 186, were not vibrating. As expected, the response under water was found to be much broader than the response in air. The difference is due to a higher damping coefficient and to a stronger beam-to-beam coupling, which tends to spread the vibration energy of the vibrating beams to beams out of resonance. In addition, it is apparent that the beams respond to the displacement of the water around them. Since the water is a continuous medium, this further broadens the response.

Figure 15:
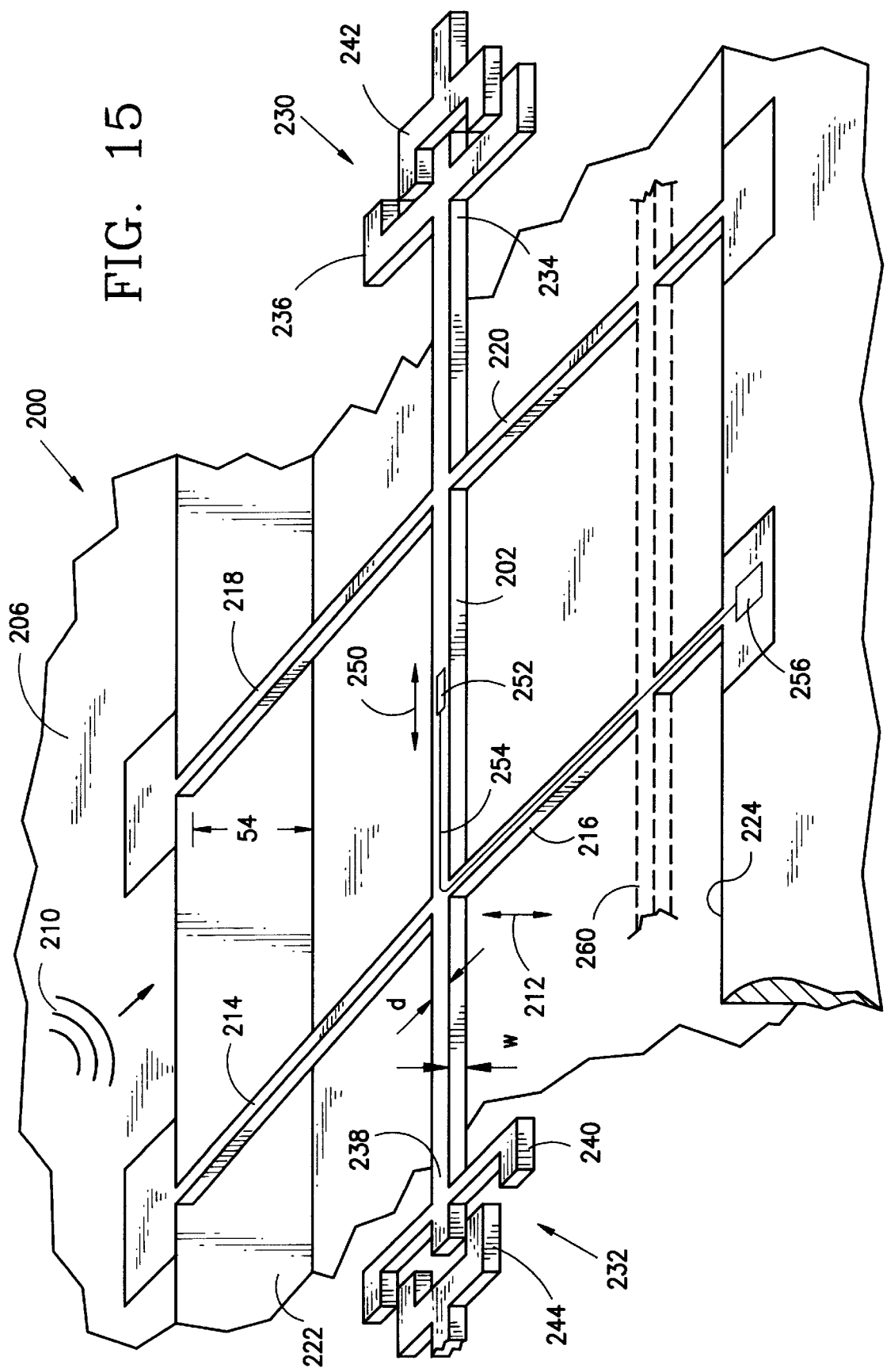
FIG. 15 is a diagrammatic perspective view of a tunable MEM beam acoustic filter element.

A technique for adjusting, or tuning the resonant response of a MEM beam is illustrated in FIG. 15, to which reference is now made. In this figure, a perspective view of a tunable MEM acoustic filter element 200 is illustrated. This tunable device incorporates a high aspect ratio resonator beam 202 mounted in a cavity 204 within a substrate 206. The beam is mounted in the cavity for vibratory motion in response to an applied acoustic signal 210, which tends to establish vibration in the beam in a direction parallel to the beam width. In this embodiment, the beam is illustrated as having its width, or thickness, in a vertical direction and its depth d in a horizontal direction, with the acoustic signal being applied in a generally vertical direction to produce vertical vibrations in the direction of arrow 212. The beam 202 is mounted in the cavity 204 by means of four support arms 214, 216, and 218, 220 extending between walls 222 and 224. These support arms are flexible and permit vibratory motion of beam 202.

To adjust its motion, vibratory beam 202 is mounted between a pair of capacitive drive elements 230 and 232, a first end 234 of the beam being connected to movable capacitive plates 236 and the second end 238 of beam 202 being connected to movable capacitive plates 240. Movable plates 236 are interleaved with stationary plates 242 mounted on substrate 206, while movable plates 240 are interleaved with stationary plates 244, also mounted on substrate 206. The application of electrical energy between plates 236 and 242 and between plates 240 and 244 cause the plates to be attracted and places tension on the beam 202. The tensile stress in beam 202, indicated by arrow 250, changes the resonant frequency of the beam so that adjustment of the voltage across the capacitor plates permits adjustment of the resonant frequency of the beam. This allows the beam to be tuned to respond to a variety of frequencies, making the device useful in a broad category of conditions, allowing the device to be used in air or in other fluids, and in a variety of temperatures or humidities. The beam may carry a sensor 252, such as the piezoresistor discussed above, which may be connected by way of line 254 to a suitable contact pad 256 on substrate 206.

It will be understood that multiple beams may be mounted in cavity 204, as illustrated in phantom at 260, with the additional beams being mounted on support arms 214, 216 and 218, 220 or being separately mounted on individual support arms, as desired. The primary vibration of beam 202 is in the central region between the support arms 214, 216 and 218, 220, with the central portion of the beam acting as a fixed—fixed beam.

Although the MEM array of beams has been described as incorporating beams having their heights perpendicular to the plane of the array, the multiple beams can be fabricated with their heights parallel to the plane of the array, as illustrated in FIG. 15 for beam 202. With such a configuration, the array will respond to sound waves impinging in a direction generally perpendicular to the plane of the array; i.e., in a vertical direction, and the vibration of each beam will also tend to be in a vertical direction because of the high aspect ratio of the beams. In such a case, the spacing between the beams and the floor of the cavity becomes important because of the layer of fluid below the beams. In such a case, the floor of the cavity can be removed by etching completely through the substrate, leaving the beams spanning across an opening in the substrate.

Although the array is described as a mechanical filter responsive to sound waves, it may be used in other ways to detect vibrations. For example, it can be mounted on a vibrating system so that the beams respond to the vibrations to produce corresponding output signals with each beam of the array serving as a narrow band accelerometer. In order to increase the sensitivity of the device and to reduce the resonant frequency of each beam, the array may be vacuum sealed. In this case, no damping is produced by a surrounding fluid, and the coupling between beams is dominated by the mechanical connections to the supporting substrate.

As noted above, the response of the array is directional, so the array acts as a dipole. In order to provide three-dimensional sensing of motion or sound waves, three arrays can be mounted on three different axes. This provides three-dimensional mapping of vibrations for each frequency. Further, since different frequencies are detected at different locations on the array, the cross-talk effects if different frequency components of the impinging sound are reduced.

The MEM sensor array is extremely small in size, and since it does not require a spectrum analyzer to separate the frequency bands contained in the received signal, the receiver device which incorporates the array can also be small. The device of the invention can be viewed as a mechanical memory, since the beams in the array respond only to frequencies which fall into their respective frequency bands. This allows the device to serve as a sensor/microphone for detection of specific sound patterns, or signatures, and to respond more quickly than prior systems. Finally, since the array is based on microelectronics technology, it can be mass produced at low cost.

Thus, there has been described a unique microelectromechanical frequency sensitive sensor array having a wide range of response, and capable of acting as an acoustic filter. The response of the device is controlled by the interaction of individual MEM beams with the surrounding fluid and the localized pressure difference between adjacent beams so that by controlling the gap between the beams, the ambient fluid, and the mechanical properties of the beams, it is possible to tailor the response of the filter to a wide range of needs. In particular, the device can be constructed to replicate to a high degree of accuracy models of the cochlea, and since it is preferably constructed of single crystal silicon, the filter can be mounted on circuit chips for use as a real-time sound processor that mimics physiologically based speech and sound processing. Although the present invention has been described in terms of preferred embodiments, variations and modifications will be apparent to those of skill in the art, and accordingly the invention is limited only by the following claims.

We claim:

1. A microelectromechanical sensor responsive to vibration, comprising:

an array of microelectromechanical released structural beam elements of different beam characteristics mounted for deflection in response to vibration to be detected, each of said beam elements being acoustically coupled to adjacent ones of said beam elements, and being spaced from adjacent ones of said beam elements by no more than approximately 20 μm; and a transducer for each beam which generates an output signal in response to the deflection of its corresponding beam element.

2. The sensor of claim 1, wherein each said beam element is resonant at a different selected frequency.

3. The sensor of claim 2, wherein said vibration is an acoustic wave impinging on said array and acoustically coupled to said beam element.

4. The sensor of claim 3, wherein said vibration is produced by mechanical motion of a structure, and wherein said array is coupled to said structure and is responsive to said vibration to serve as an accelerometer.

5. The sensor of claim 1, wherein each said beam element includes a first end and a second end each fixed to a substrate.

6. The sensor of claim 5, wherein each said beam includes a central portion released from said substrate for relative motion with respect to the substrate.

7. The sensor of claim 6, wherein said first and second ends of each said beam element are each secured to respective tension-adjusting devices for tuning the resonant frequencies of respective beams.

8. The sensor of claim 6, further including means associated with at least one of said beams for adjusting the resonant frequency of the beam.

9. The sensor of claim 1, wherein the vibration to be detected has a frequency signature to be detected, and wherein said beam elements have resonant frequencies corresponding to frequency components of said frequency signature to produce transducer output signals corresponding to said frequency signature.

10. The sensor of claim 1, wherein said beam elements are each resonant at a different acoustic frequency to form an acousto-mechanical filter.

11. The sensor of claim 1, wherein each of said beam elements is responsive to a selected vibration frequency band to produce a corresponding transducer output signal.

12. The sensor of claim 11, wherein said vibration to be detected has a frequency signature, and wherein said transducer output signals from all of said beam elements represent said frequency signature.

13. The sensor of claim 11, wherein said vibration to be detected is speech, and wherein said transducer output signals from all said beams represent said speech.

14. The sensor of claim 11, wherein said different beam characteristics are beam lengths.

15. The sensor of claim 14, wherein said beams are fabricated from a common material and have substantially the same cross-sections, whereby the response of each beam to a selected frequency band is determined by beam length.

16. The sensor of claim 15, further including means for adjusting the response of each beam to a selected frequency band for tuning said array.

17. The sensor of claim 16, wherein said means for adjusting includes capacitor means coupled to each said beam.

18. The sensor of claim 14, wherein said array includes multiple beam elements of different lengths, said lengths varying exponentially from one beam to the next.

19. The sensor of claim 1, wherein said array includes a substrate having a cavity, said beam elements each being integral with and fabricated from said substrate and extending into said cavity.

20. The sensor of claim 19, wherein w\said substrate and said beam elements are single crystal silicon.

21. The sensor of claim 20, wherein said beams extend across said cavity and are fixed at opposite ends to said substrate at cavity walls formed during fabrication of said beams.

22. The sensor of claim 21, wherein said beams are generally parallel to each other and lie in a common array plane.

23. The sensor of claim 22, wherein each beam element has a width of about 1 μm and a height of about 10 μm to provide a high aspect ratio which constrains deflection of the beam element to substantially said common array plane.

24. The sensor of claim 23, wherein said cavity has a floor spaced about 100 μm below said beam elements.

25. The sensor of claim 23, wherein said beam elements have a length of greater than 370 μm.

26. The sensor of claim 22, wherein each beam element has a width of about 10 μm and a height of about 1 μm to provide a high aspect ratio which constrains deflection of the beam element to a direction substantially perpendicular to said common array plane.

27. A microelectromechanical sensor responsive to vibration, comprising:

an array of microelectromechanical released structural beam elements of different beam characteristics mounted for deflection in response to vibration to be detected, each said beam element including a first end and a second end each fixed to a substrate, and a central portion released from said substrate for relative motion with respect to the substrate;

a plurality of tension-adjusting devices for tuning the resonant frequencies of respective beams, said first and second ends of each said beam elements being secured to respective ones of said tension-adjusting devices; and a transducer for each beam which generates an output signal in response to the deflection of its corresponding beam.

* * * * *

UNITED STATES PATENT AND TRADEMARK OFFICE
CERTIFICATE OF CORRECTION

PATENT NO. : 5,856,722
DATED : January 5, 1999
INVENTOR(S) : Haronian et al.

It is certified that error appears in the above-indentified patent and that said Letters Patent is hereby corrected as shown below:

Claim 8, line 1, change "6" to "1".

Signed and Sealed this

First Day of June, 1999

Attest:

Q. TODD DICKINSON

Attesting Officer

Acting Commissioner of Patents and Trademarks